(12) United States Patent
Wang et al.

(10) Patent No.: US 11,957,064 B2
(45) Date of Patent: Apr. 9, 2024

(54) SEMICONDUCTOR DEVICE AND METHOD FOR FABRICATING THE SAME

(71) Applicant: UNITED MICROELECTRONICS CORP., Hsin-Chu (TW)

(72) Inventors: Hui-Lin Wang, Taipei (TW); Chen-Yi Weng, New Taipei (TW); Yi-Wei Tseng, New Taipei (TW); Chin-Yang Hsieh, Tainan (TW); Jing-Yin Jhang, Tainan (TW); Yi-Hui Lee, Taipei (TW); Ying-Cheng Liu, Tainan (TW); Yi-An Shih, Changhua County (TW); I-Ming Tseng, Kaohsiung (TW); Yu-Ping Wang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/967,904

(22) Filed: Oct. 18, 2022

(65) Prior Publication Data
US 2023/0038528 A1 Feb. 9, 2023

Related U.S. Application Data

(60) Continuation of application No. 17/308,057, filed on May 5, 2021, now Pat. No. 11,508,904, which is a (Continued)

(30) Foreign Application Priority Data

May 20, 2019 (CN) .......................... 201910418706.2

(51) Int. Cl.
*H10N 50/80* (2023.01)
*G11C 5/06* (2006.01)
(Continued)

(52) U.S. Cl.
CPC ............... *H10N 50/80* (2023.02); *G11C 5/06* (2013.01); *G11C 11/16* (2013.01); *G11C 11/161* (2013.01); *H01L 29/82* (2013.01); *H10N 50/01* (2023.02); *H10N 50/10* (2023.02); *G11C 2211/5615* (2013.01); *H10B 61/00* (2023.02)

(58) Field of Classification Search
CPC ........ H10N 50/80; H10N 50/10; H01L 29/82; G11C 5/06; G11C 2211/5615; G11C 11/16
See application file for complete search history.

(56) References Cited

U.S. PATENT DOCUMENTS 8,482,966 B2 7/2013 Kang et al.
9,070,869 B2 6/2015 Jung
(Continued)

FOREIGN PATENT DOCUMENTS

CN 107017338 A 8/2017
CN 109524542 A 3/2019

*Primary Examiner* — Joseph C. Nicely
(74) *Attorney, Agent, or Firm* — Winston Hsu

(57) ABSTRACT

A semiconductor device includes a magnetic tunneling junction (MTJ) on a substrate, a spacer adjacent to the MTJ, a liner adjacent to the spacer, and a first metal interconnection on the MTJ. Preferably, the first metal interconnection includes protrusions adjacent to two sides of the MTJ and a bottom surface of the protrusions contact the liner directly.

13 Claims, 11 Drawing Sheets

Related U.S. Application Data division of application No. 16/438,480, filed on Jun. 12, 2019, now Pat. No. 11,063,206.

(51) Int. Cl.
*G11C 11/16* (2006.01)
*H01L 29/82* (2006.01)
*H10N 50/01* (2023.01)
*H10N 50/10* (2023.01)
*H10B 61/00* (2023.01)

(56) References Cited

U.S. PATENT DOCUMENTS

| | | | |
|---|---|---|---|
| 9,444,033 B2 | 9/2016 | Cho | |
| 10,269,401 B2 | 4/2019 | Seo | |
| 10,580,968 B1* | 3/2020 | Yi | H10B 61/00 |
| 10,714,679 B2 | 7/2020 | Yang | |
| 2009/0237982 A1 | 9/2009 | Assefa | |
| 2013/0032775 A1 | 2/2013 | Satoh | |
| 2013/0267042 A1 | 10/2013 | Satoh | |
| 2017/0084667 A1 | 3/2017 | Lim | |
| 2017/0092693 A1 | 3/2017 | Tan | |
| 2018/0182810 A1 | 6/2018 | Yi | |
| 2018/0205002 A1 | 7/2018 | Bak | |
| 2018/0366640 A1 | 12/2018 | Clevenger | |
| 2019/0066746 A1 | 2/2019 | Li | |
| 2019/0088864 A1* | 3/2019 | Cho | H10B 61/22 |
| 2019/0148628 A1 | 5/2019 | Niu | |
| 2019/0173001 A1 | 6/2019 | Lee | |
| 2019/0304741 A1 | 10/2019 | Niwa | |
| 2020/0006631 A1 | 1/2020 | Sato | |
| 2020/0006638 A1* | 1/2020 | Chen | H10B 61/22 |
| 2020/0013826 A1 | 1/2020 | Reznicek | |
| 2020/0098976 A1 | 3/2020 | Jacob | |
| 2020/0135805 A1 | 4/2020 | Hsu | |
| 2020/0144484 A1 | 5/2020 | Chen | |
| 2020/0227625 A1 | 7/2020 | Wang | |
| 2020/0266335 A1* | 8/2020 | Wang | H10N 50/80 |
| 2020/0350171 A1 | 11/2020 | Zhou | |
| 2020/0350494 A1 | 11/2020 | Dutta | |
| 2022/0077385 A1* | 3/2022 | Chen | H10N 50/01 |
| 2022/0336728 A1 | 10/2022 | Lin | |

* cited by examiner

US 11,957,064 B2

SEMICONDUCTOR DEVICE AND METHOD FOR FABRICATING THE SAME

CROSS REFERENCE TO RELATED APPLICATIONS

This application is a continuation application of U.S. application Ser. No. 17/308,057, filed on May 5, 2021, which is a division of U.S. application Ser. No. 16/438,480, filed on Jun. 12, 2019. The contents of these applications are incorporated herein by reference.

BACKGROUND OF THE INVENTION

1. Field of the Invention

The invention relates to a semiconductor device and method for fabricating the same, and more particularly to a magnetoresistive random access memory (MRAM) and method for fabricating the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a semiconductor device includes a magnetic tunneling junction (MTJ) on a substrate, a spacer adjacent to the MTJ, a liner adjacent to the spacer, and a first metal interconnection on the MTJ. Preferably, the first metal interconnection includes protrusions adjacent to two sides of the MTJ and a bottom surface of the protrusions contact the liner directly.

According to another aspect of the present invention, a semiconductor device includes a magnetic tunneling junction (MTJ) on a substrate, a first liner adjacent to the MTJ, a second liner on the first liner, and a first metal interconnection on the MTJ. Preferably, a sidewall of the first metal interconnection is aligned with a sidewall of the first liner.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
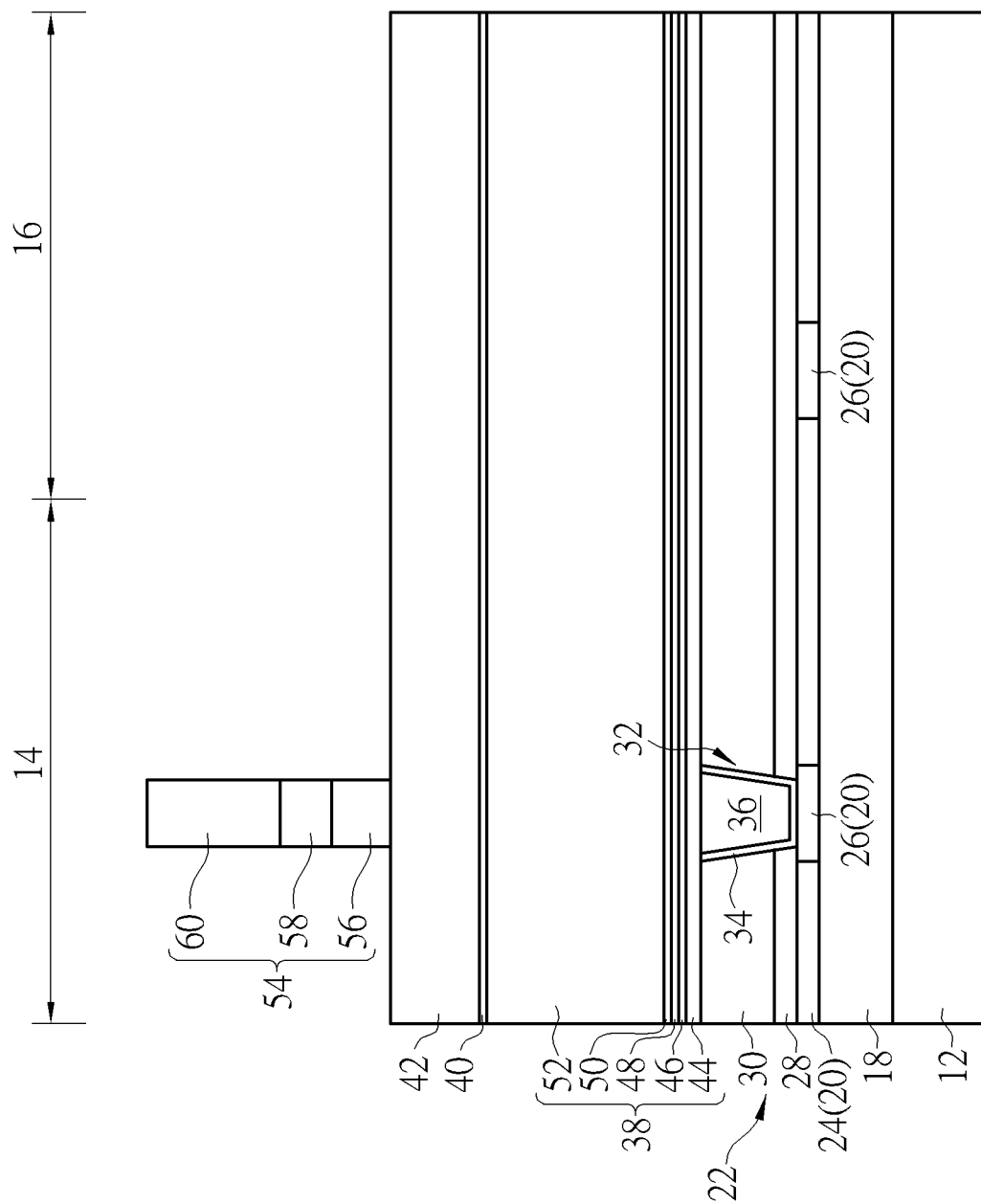
FIGS. 1-6 illustrate a method for fabricating a semiconductor device according to an embodiment of the present invention.

Referring to FIGS. 1-6, FIGS. 1-6 illustrate a method for fabricating a semiconductor device, or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MTJ region 14 and a logic region 16 are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MTJ region 14 and the edge region 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and metal interconnections 32 embedded in the stop layer 28 and the IMD layer 30.

In this embodiment, each of the metal interconnections 26 from the metal interconnect structure 20 preferably includes a trench conductor and each of the metal interconnections 32 from the metal interconnect structure 22 on the MTJ region 14 includes a via conductor. Preferably, each of the metal interconnections 26, 32 from the metal interconnect structures 20, 22 could be embedded within the IMD layers 24,

30 and/or stop layer 28 according to a single damascene process or dual damascene process. For instance, each of the metal interconnections 26, 32 could further includes a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 are preferably made of copper, the IMD layers 24, 30 are preferably made of silicon oxide, and the stop layers 28 is preferably made of nitrogen doped carbide (NDC), silicon nitride, silicon carbon nitride (SiCN), or combination thereof.

Next, a MTJ stack 38 or stack structure is formed on the metal interconnect structure 22, a cap layer 40 is formed on the MTJ stack 38, and another cap layer 42 formed on the cap layer 40. In this embodiment, the formation of the MTJ stack 38 could be accomplished by sequentially depositing a first electrode layer 44, a fixed layer 46, a free layer 48, a capping layer 50, and a second electrode layer 52 on the IMD layer 30. In this embodiment, the first electrode layer 44 and the second electrode layer 52 are preferably made of conductive material including but not limited to for example Ta, Pt, Cu, Au, Al, or combination thereof. The fixed layer 46 could be made of antiferromagnetic (AFM) material including but not limited to for example ferromanganese (FeMn), platinum manganese (PtMn), iridium manganese (IrMn), nickel oxide (NiO), or combination thereof, in which the fixed layer 46 is formed to fix or limit the direction of magnetic moment of adjacent layers. The free layer 48 could be made of ferromagnetic material including but not limited to for example iron, cobalt, nickel, or alloys thereof such as cobalt-iron-boron (CoFeB), in which the magnetized direction of the free layer 48 could be altered freely depending on the influence of outside magnetic field. The capping layer 50 could be made of insulating material including but not limited to for example oxides such as aluminum oxide ($AlO_x$) or magnesium oxide (MgO). Preferably, the cap layer 40 and cap layer 42 are made of different materials. For instance, the cap layer 40 is preferably made of silicon nitride and the cap layer 42 is made of silicon oxide, but not limited thereto.

Next, a patterned mask 54 is formed on the cap layer 42. In this embodiment, the patterned mask 54 could include an organic dielectric layer (ODL) 56, a silicon-containing hard mask bottom anti-reflective coating (SHB) 58, and a patterned resist 60.

Figure 2:
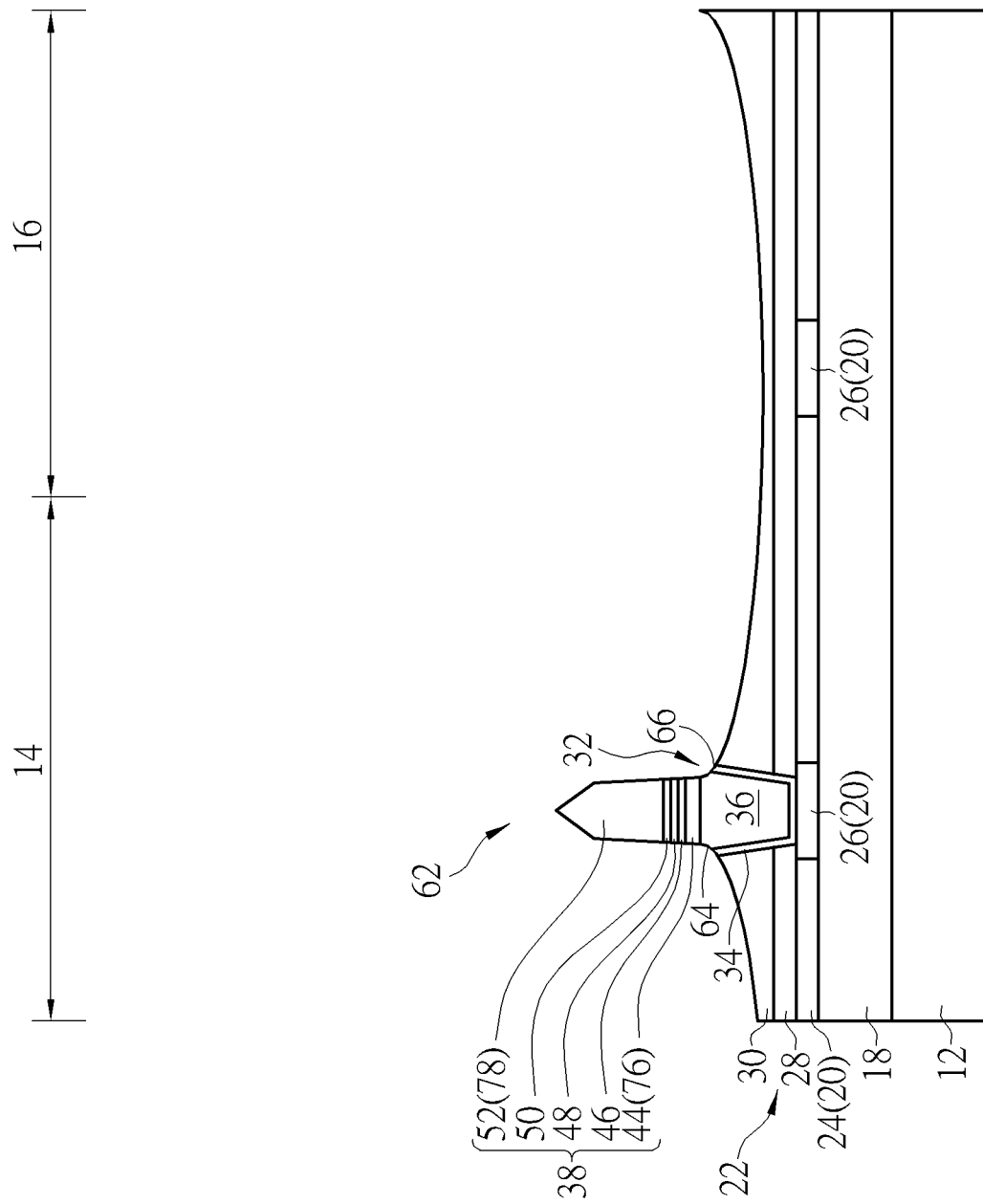

Next, as shown in FIG. 2, one or more etching process is conducted by using the patterned mask 54 as mask to remove part of the cap layers 40, 42, part of the MTJ stack 38, and part of the IMD layer 30 to form a MTJ 62 on the MTJ region 14, in which the first electrode layer 44 at this stage preferably becomes a bottom electrode 76 for the MTJ 62 while the second electrode layer 52 becomes a top electrode 78 for the MTJ 62 and the cap layers 40, 42 could be removed during the etching process. It should be noted that this embodiment preferably conducts a reactive ion etching (RIE) process by using the patterned mask 54 as mask to remove part of the cap layers 40, 42 and part of the MTJ stack 38, strips the patterned mask 54, and then conducts an ion beam etching (IBE) process by using the patterned cap layer 42 as mask to remove part of the MTJ stack 38 and part of the IMD layer 30 to form MTJ 62. Due to the characteristics of the IBE process, the top surface of the remaining IMD layer 30 is slightly lower than the top surface of the metal interconnections 32 after the IBE process and the top surface of the IMD layer 30 also reveals a curve or an arc.

It should also be noted that when the IBE process is conducted to remove part of the IMD layer 30, part of the metal interconnection 32 is removed at the same time so that a first slanted sidewall 64 and a second slanted sidewall 66 are formed on the metal interconnection 32 adjacent to the MTJ 62, in which each of the first slanted sidewall 64 and the second slanted sidewall 66 could further include a curve (or curved surface) or a planar surface. Moreover, if the second electrode layer 52 were made of tantalum (Ta), more second electrode layer 52 closer to the tip of the MTJ 62 is preferably removed during the patterning of the MTJ stack 38 through the IBE process so that inclined sidewalls and top surfaces are formed on the patterned MTJ 62. Specifically, the tip or top portion the top electrode 78 of the MTJ 62 formed at the stage preferably includes a reverse V-shape or a curve (not shown) while two sidewalls of the MTJ 62 are slanted sidewalls.

Figure 3:
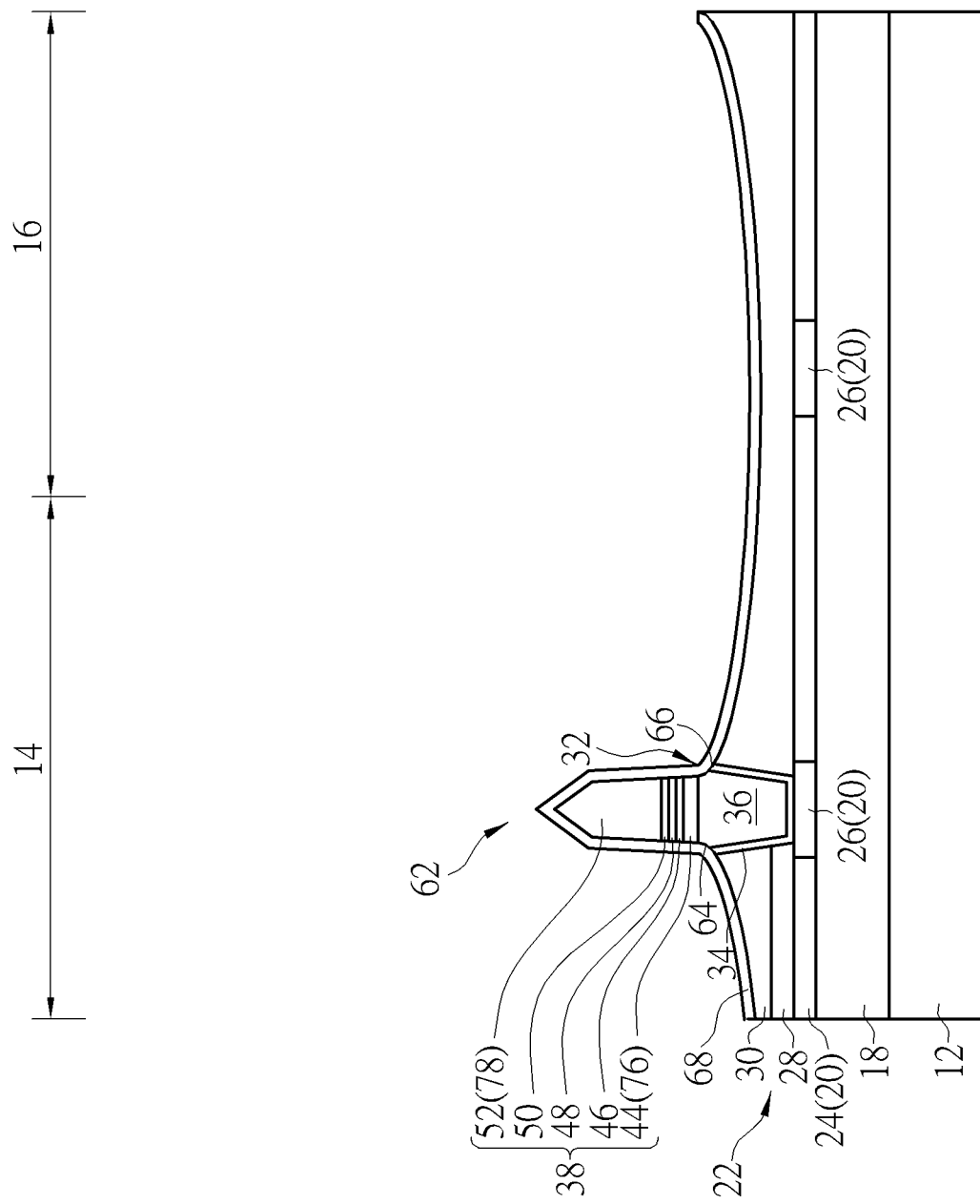

Next, as shown in FIG. 3, a liner 68 is formed on the MTJ 62 to cover the surface of the IMD layer 30. In this embodiment, the liner 68 is preferably made of silicon nitride (SiN), but could also be made of other dielectric material including but not limited to for example silicon oxide, silicon oxynitride, or silicon carbon nitride.

Figure 4:
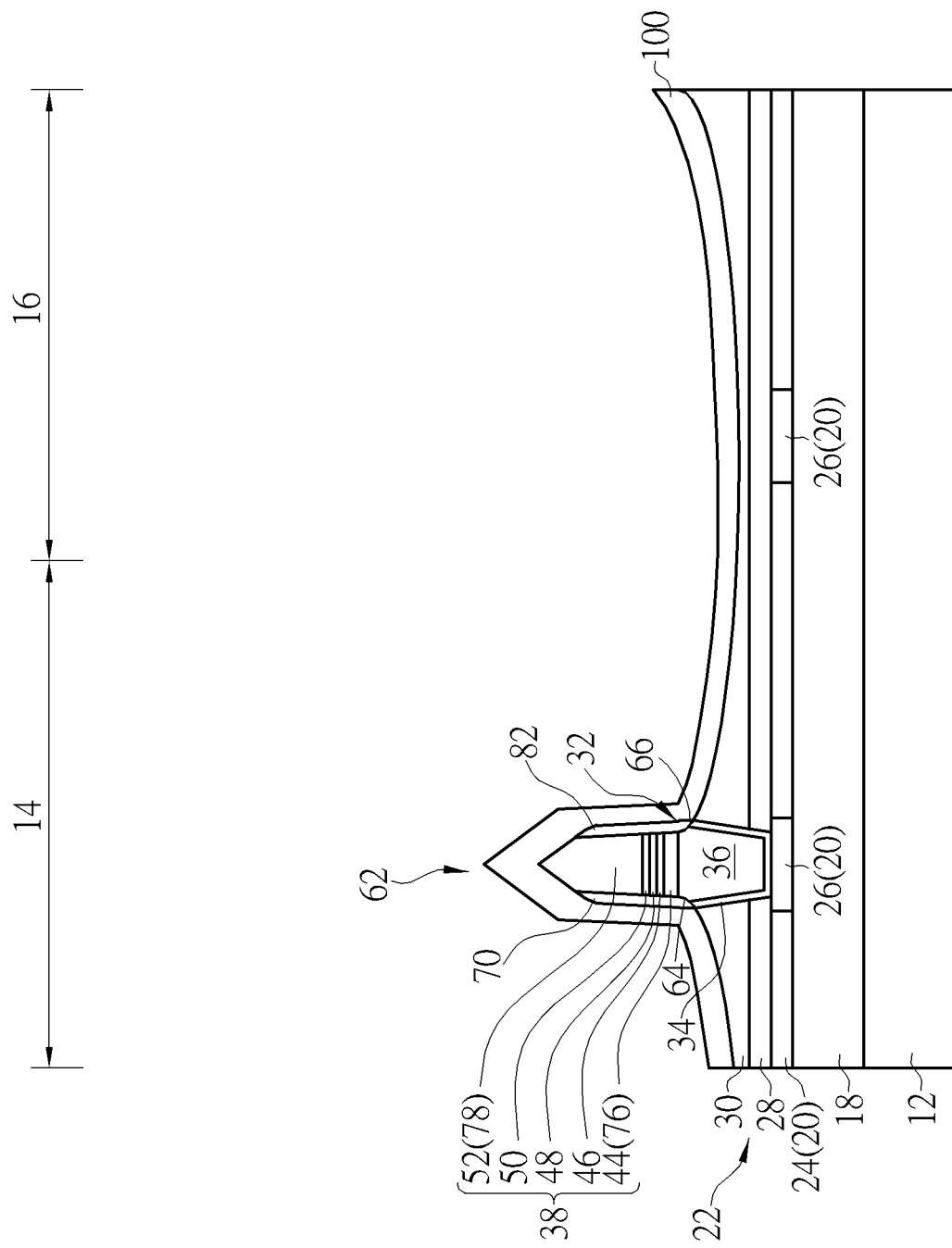

Next, as shown in FIG. 4, an etching process is conducted to remove part of the liner 68 to form a spacer including a first spacer 70 and a second spacer 82 adjacent to the MTJ 62, in which the first spacer 70 is disposed on a sidewall of the MTJ 62 to cover and contact the first slanted sidewall 64 of the metal interconnection 32 and the second spacer 82 and the second spacer 82 is disposed on another sidewall of the MTJ 62 to cover an contact the second slanted sidewall 66.

Next, an atomic layer deposition (ALD) process is conducted to form a second liner 100 to cover the surfaces of the IMD layer 30, the MTJ 62, the first spacer 70, and the second spacer 82. In this embodiment, the first liner 68 and the second liner 100 are preferably made of different materials, in which the first liner 68 preferably includes silicon nitride (SiN) while the second liner 100 preferably includes silicon oxide or tetraethyl orthosilicate (TEOS). Nevertheless, according to other embodiments of the present invention, the two layers 68, 100 could also be selected from the group consisting of SiN, $SiO_2$, SiON, and SiCN while the two layers 68, 100 are made of different materials. Moreover, the thickness of the first spacer 70 and/or second spacer 82 could be substantially the same as the thickness of the second liner 100.

Figure 5:
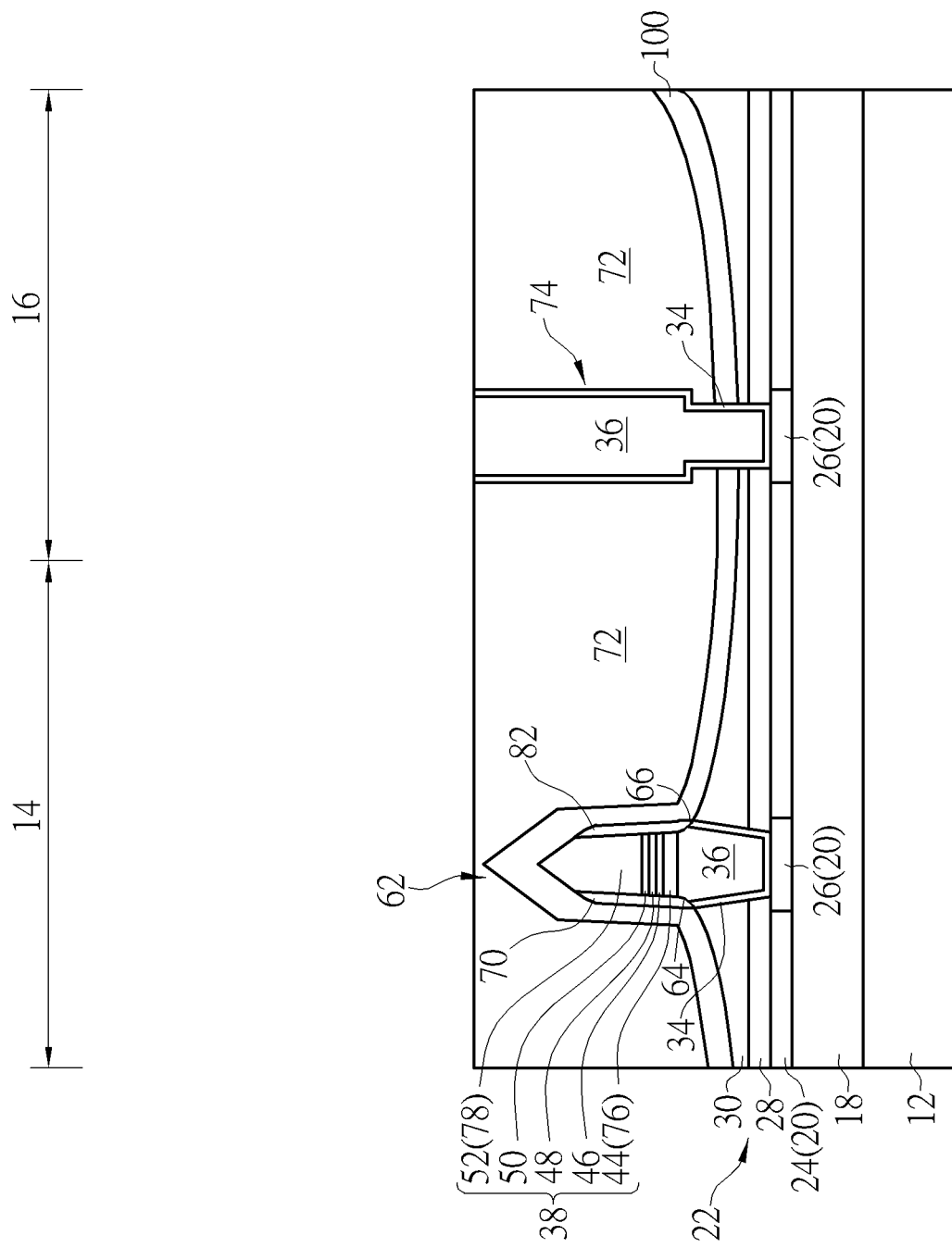

Next, as shown in FIG. 5, another IMD layer 72 is formed on the MTJ region 14 and logic region 16, and a pattern transfer process is conducted by using a patterned mask (not shown) to remove part of the IMD layer 72 on the logic region 16 to form a contact hole (not shown) exposing the metal interconnection 26 underneath and metals are deposited into the contact hole afterwards. For instance, a barrier layer 34 selected from the group consisting of titanium (Ti), titanium nitride (TiN), tantalum (Ta), and tantalum nitride (TaN) and metal layer 36 selected from the group consisting of tungsten (W), copper (Cu), aluminum (Al), titanium aluminide (TiAl), and cobalt tungsten phosphide (CoWP) could be deposited into the contact holes, and a planarizing process such as chemical mechanical polishing (CMP) process could be conducted to remove part of the metals including the aforementioned barrier layer and metal layer to form a contact plug 74 in the contact hole electrically connecting the metal interconnection 26.

Figure 6:
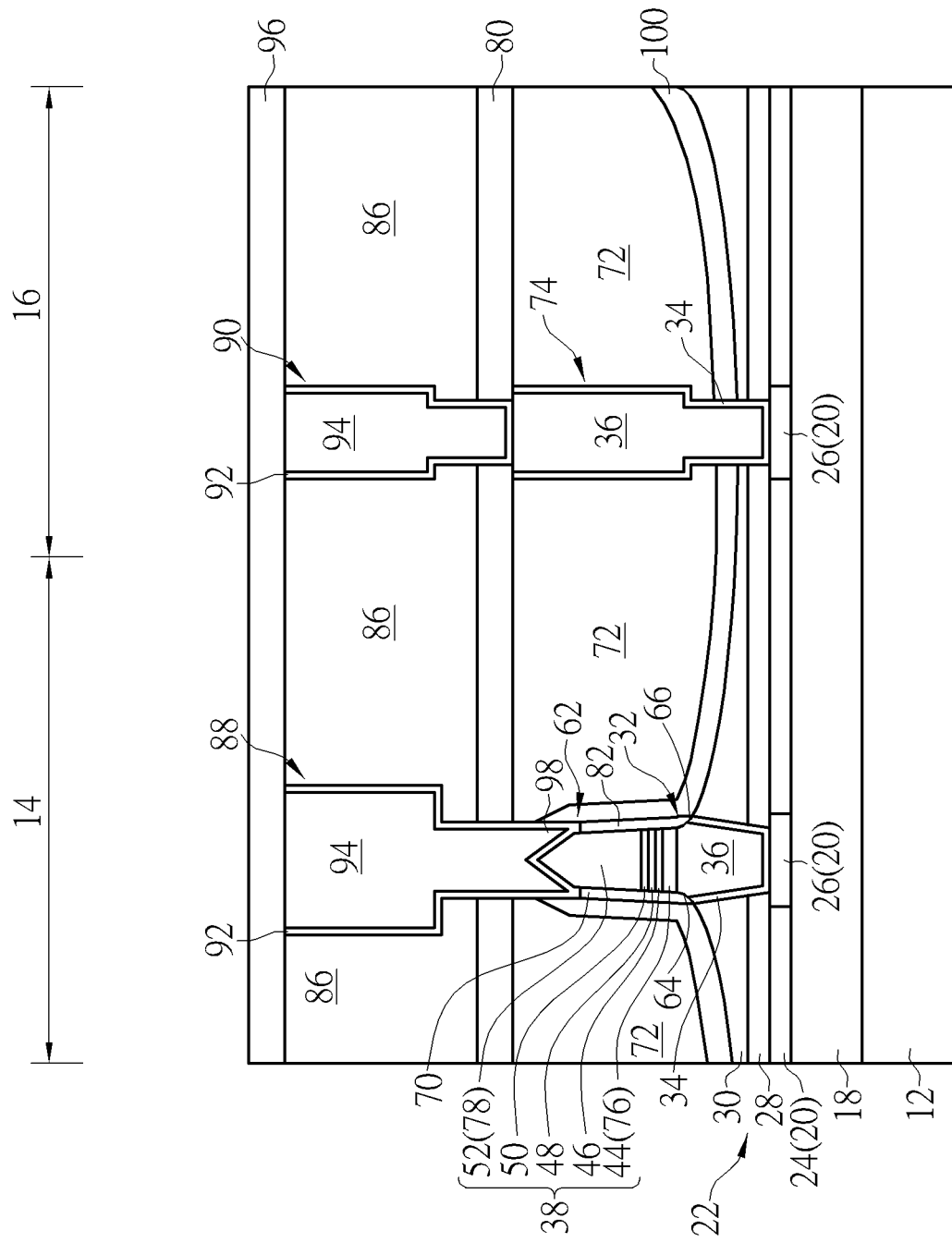

Next, as shown in FIG. 6, a stop layer 80 and another IMD layer 86 are formed on the MTJ 62 to cover the surface of the IMD layer 72, and one or more photo-etching process is conducted to remove part of the IMD layer 86, part of the stop layer 80, part of the IMD layer 72, part of the second liner 100, and even part of the spacer adjacent to the MTJ 62 on the MTJ region 14 and part of the IMD layer 86 and part of the stop layer 80 on the logic region 16 to form contact holes (not shown). Next, conductive materials are deposited into each of the contact holes and a planarizing process such as CMP is conducted to form metal interconnections 88, 90 directly connecting the MTJ 62 and contact plug 74 on the MTJ region 14 and logic region 16, in which the metal interconnection 88 including protrusions 98 on the MTJ region 14 preferably directly contacts the MTJ 62 and/or left and right sidewalls of the top electrode 78 underneath while the metal interconnection 90 on the logic region 16 directly contacts the contact plug 74 on the lower level. Next, another stop layer 96 is formed on the IMD layer 86 to cover the metal interconnections 88, 90. In this embodiment, the width of the metal interconnection 88, especially the via conductor of the metal interconnection 88 directly contacting the MTJ 62 is preferably greater than the width of the MTJ 62, the bottom of each of the protrusions 98 or protruding portions include a planar surface, and the bottom surfaces of the protrusions 98 are preferably higher than the top surface of the capping layer 50. Moreover, the bottom surface of each of the protrusions 98 contact the first spacer 70 and the second spacer 82 respectively, the sidewalls of each of the protrusions 98 are aligned with sidewalls of the first spacer 70 and the second spacer 82, and the thickness or width of each of the first spacer 70 and the second spacer 82 could be less than or equal to the thickness or width of the second liner 100.

In this embodiment, the stop layer 80 and the stop layer 28 could be made of same material or different material. For example, both layers 80, 28 could include nitrogen doped carbide (NDC), silicon nitride, silicon carbon nitride (SiCN), or combination thereof. Similar to the metal interconnections formed previously, each of the metal interconnections 88, 90 could be formed in the IMD layer 86 through a single damascene or dual damascene process. For instance, each of the metal interconnections 88, 90 could further include a barrier layer 92 and a metal layer 94, in which the barrier layer 92 could be selected from the group consisting of titanium (Ti), titanium nitride (TiN), tantalum (Ta), and tantalum nitride (TaN) and the metal layer 94 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. This completes the fabrication of a semiconductor device according to an embodiment of the present invention.

Figure 7:
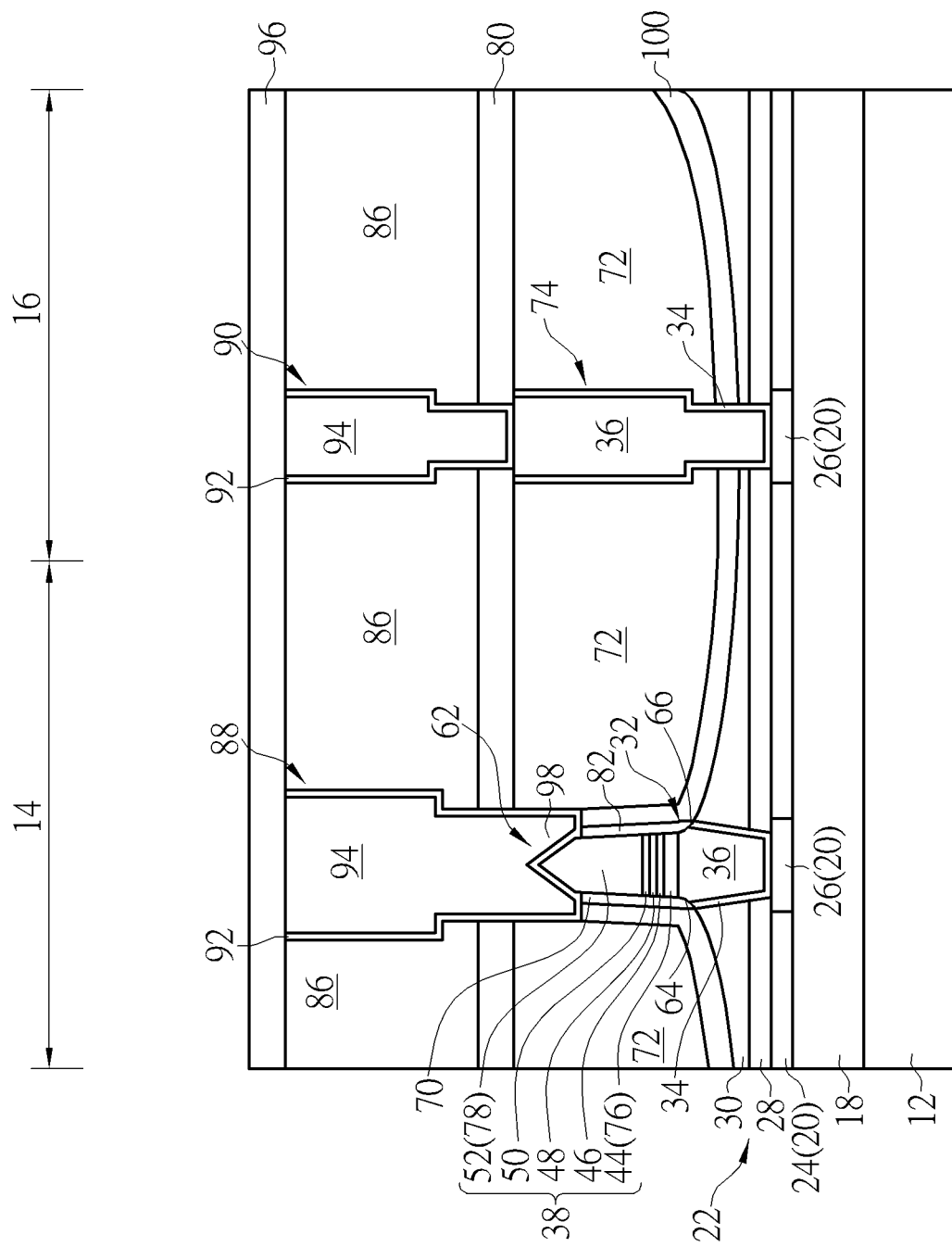
FIG. 7 illustrates a structural view of a semiconductor device according to an embodiment of the present invention.

Referring to FIG. 7, FIG. 7 illustrates a structural view of a semiconductor device according to an embodiment of the present invention. As shown in FIG. 7, in contrast to the bottom surfaces of the protrusions 68 directly contacting the top surfaces of the first spacer 70 and the second spacer 82 while sidewalls of each of the protrusions 98 are aligned with sidewalls of the first spacer 70 and second spacer 82 respectively as shown in FIG. 6, it would also be desirable to width of the protrusions 98 such that the bottom surfaces of the protrusions 98 directly contact the top surface of the first spacer 70, the top surface of the second spacer 82, and the top surface of the second liner 100 while sidewalls of the protrusions 98 are aligned with sidewalls of the second liner 100, which is also within the scope of the present invention.

Figure 8:
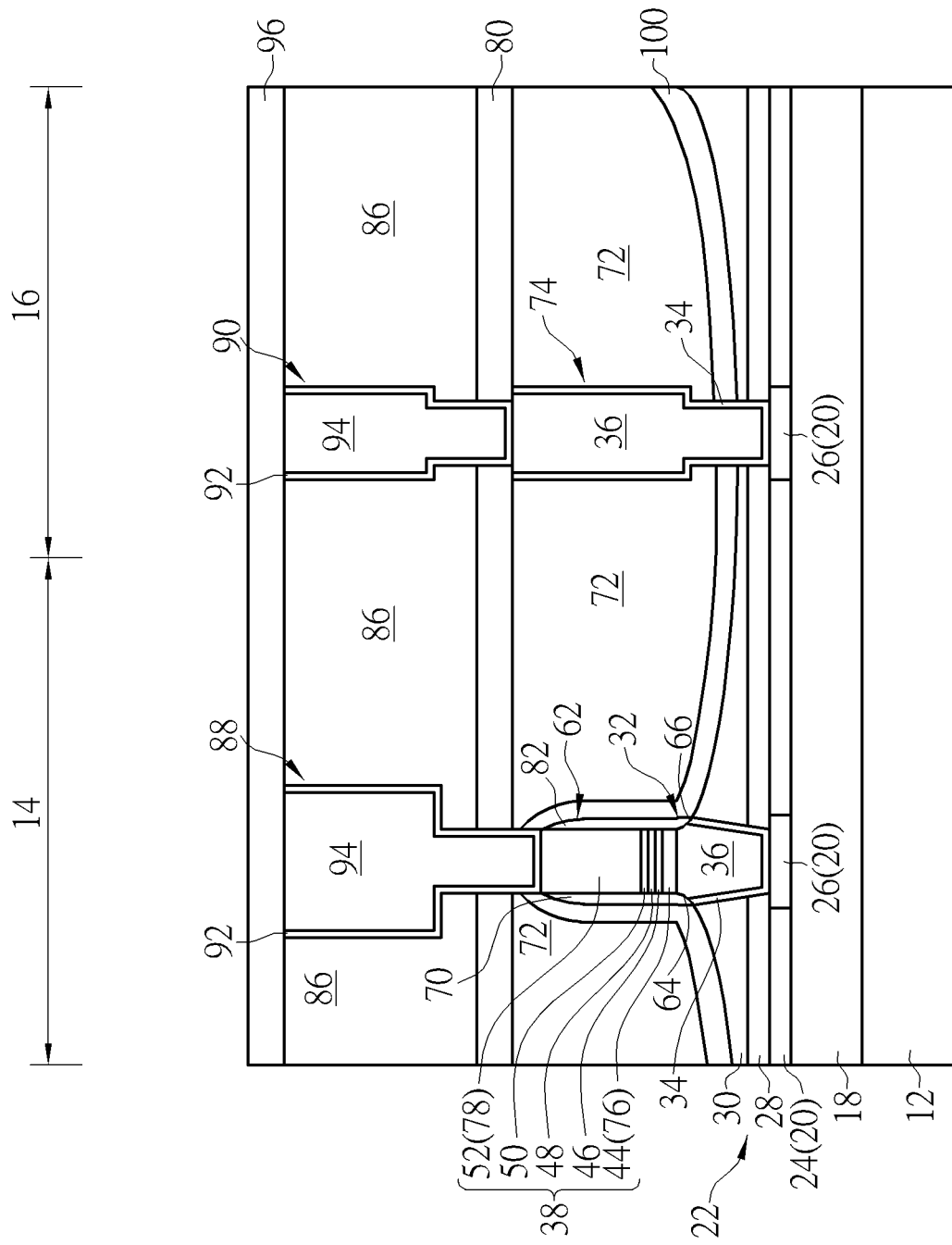
FIG. 8 illustrates a structural view of a semiconductor device according to an embodiment of the present invention.

Referring to FIG. 8, FIG. 8 illustrates a structural view of a semiconductor device according to an embodiment of the present invention. As shown in FIG. 8, in contrast to the top electrode 78 being made of tantalum (Ta) as shown in FIG. 6, the top electrode 78 of this embodiment is preferably made of titanium nitride (TiN) so that when the second electrode layer 52 is patterned by etching process to form the MTJ 62 in FIG. 2 the top electrode 78 of the MTJ 62 preferably includes a planar top surface and planar and vertical sidewalls. Next, fabrications illustrated in FIGS. 3-6 are conducted to form a first liner 62 on sidewalls of the MTJ 62, remove part of the first liner 68 to form a first spacer 70 and second spacer 82 adjacent to the MTJ 62, form a second liner 100 to cover the IMD layer 30, the MTJ 62, the first spacer 70, and the second spacer 82, form an IMD layer 72, a stop layer 80, and another IMD layer 86 on the MTJ 62, and form metal interconnections 88, 90 connecting the MTJ 62 and metal interconnection 72.

Figure 9:
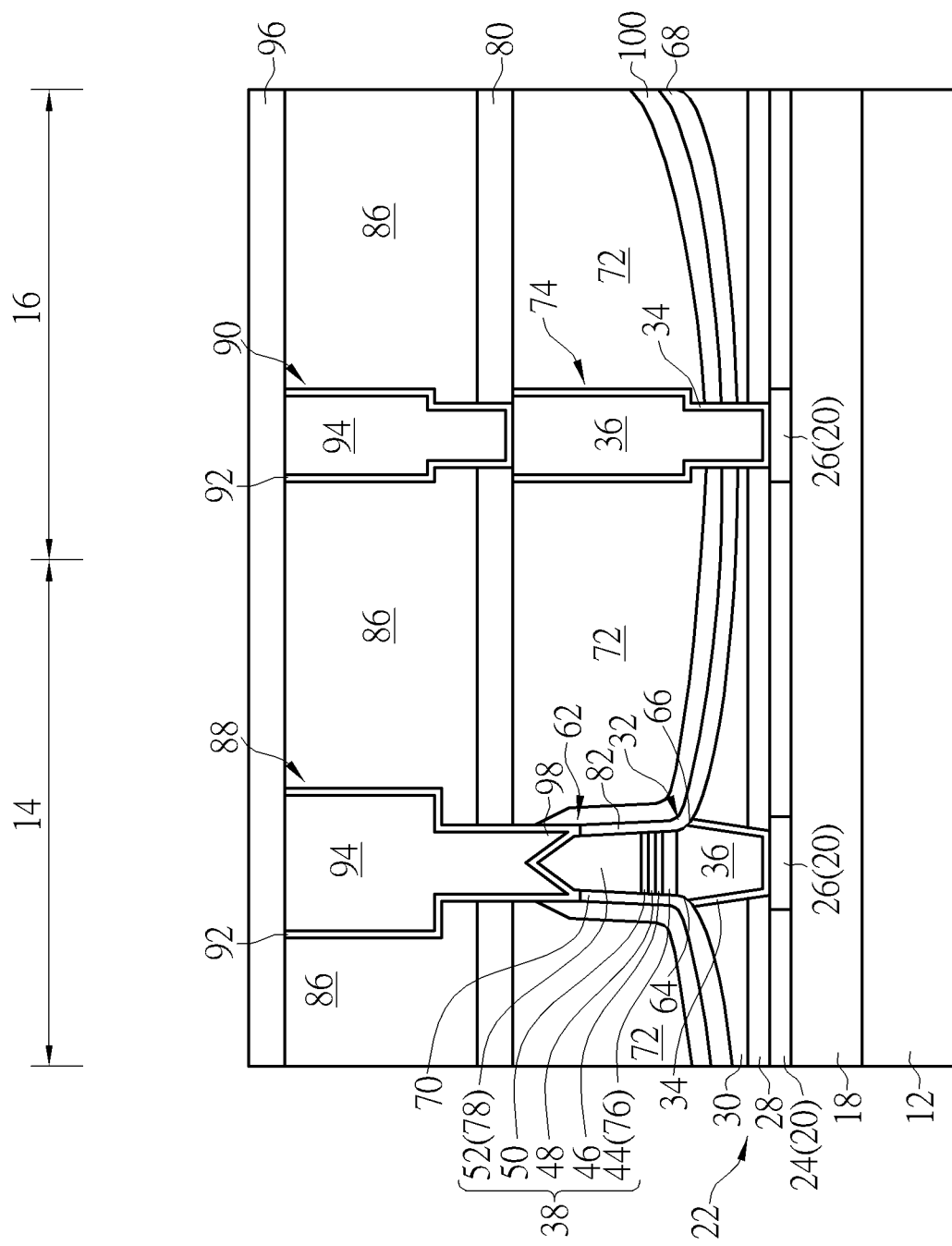
FIG. 9 illustrates a structural view of a semiconductor device according to an embodiment of the present invention.

Referring to FIG. 9, FIG. 9 illustrates a structural view of a semiconductor device according to an embodiment of the present invention. As shown in FIG. 9, it would also be desirable to first form the first liner 68 as shown in FIG. 3, skip the etching process conducted in FIG. 4, and then directly form a second liner 100 on the surface of the first liner 68. Next, processes conducted in FIGS. 5-6 could be carried out to form an IMD layer 72, a stop layer 80, and another IMD layer 86 on the second liner 100, and finally form metal interconnections 88, 90 to connect the MTJ 62 and the metal interconnection 74 respectively.

It should be noted since the first liner 68 has not been etched to form spacers in this embodiment, the first liner 68 itself after being deposited on the surface of the IMD layer 30 and MTJ 62 preferably include uneven thickness. For instance, the portion of the first liner 68 disposed on or directly contacting sidewalls of the MTJ 62 and the portion of the first liner 68 disposed on or directly contacting the top surface of the IMD layer 30 preferably include different thicknesses, in which the thickness of the first liner 68 directly contacting sidewalls of the MTJ 62 is preferably less than the thickness of the first liner 68 directly contacting the top surface of the IMD layer 30. In this embodiment, the thickness of the first liner 68 disposed on the sidewalls of the MTJ 62 is preferably between 5-30 nm while the thickness of the first liner 68 disposed on the top surface of the IMD layer 30 is between 6-40 nm. In contrast to the first liner 68 having uneven thickness, the second liner 100 disposed on the surface of the first liner 68 preferably includes an even thickness while the thickness of the second liner 100 is preferably equal to the thickness of the first liner 68 disposed on sidewalls of the MTJ 62 or between 5-30 nm.

Figure 10:
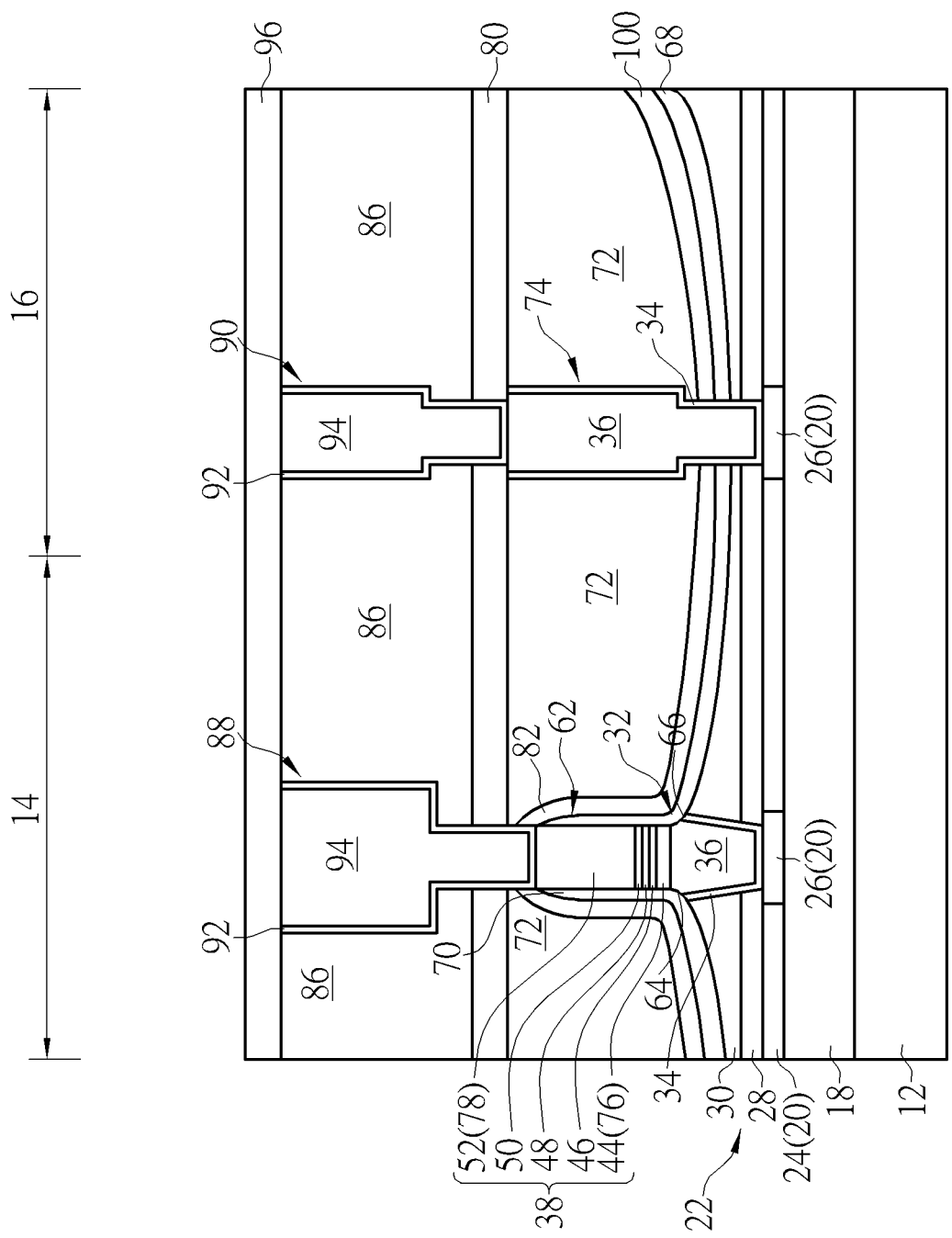
FIG. 10 illustrates a structural view of a semiconductor device according to an embodiment of the present invention.

Referring to FIG. 10, FIG. 10 illustrates a structural view of a semiconductor device according to an embodiment of the present invention. As shown in FIG. 10, it would be desirable to form a top electrode 78 made of TiN as shown in FIG. 8, and then follow the embodiment as disclosed in FIG. 9 to form a first liner 68 according to FIG. 3, skip the etching process conducted in FIG. 4, and then directly form a second liner 100 on the surface of the first liner 68. Next, processes conducted in FIGS. 5-6 could be carried out to form an IMD layer 72, a stop layer 80, and another IMD layer 86 on the second liner 100, and finally form metal interconnections 88, 90 to connect the MTJ 62 and the metal interconnection 74 respectively.

Similar to the embodiment disclosed in FIG. 9, since the first liner 68 has not been etched to form spacers in this embodiment, the first liner 68 itself after being deposited on the surface of the IMD layer 30 and MTJ 62 preferably include uneven thickness. For instance, the portion of the first liner 68 disposed on or directly contacting sidewalls of the MTJ 62 and the portion of the first liner 68 disposed on or directly contacting the top surface of the IMD layer 30 preferably include different thicknesses, in which the thickness of the first liner 68 directly contacting sidewalls of the MTJ 62 is preferably less than the thickness of the first liner 68 directly contacting the top surface of the IMD layer 30. In this embodiment, the thickness of the first liner 68 disposed on the sidewalls of the MTJ 62 is preferably between 5-30 nm while the thickness of the first liner 68 disposed on the top surface of the IMD layer 30 is between 6-40 nm. In contrast to the first liner 68 having uneven thickness, the second liner 100 disposed on the surface of the first liner 68 preferably includes an even thickness while the thickness of the second liner 100 is preferably equal to the thickness of the first liner 68 disposed on sidewalls of the MTJ 62 or between 5-30 nm.

Figure 11:
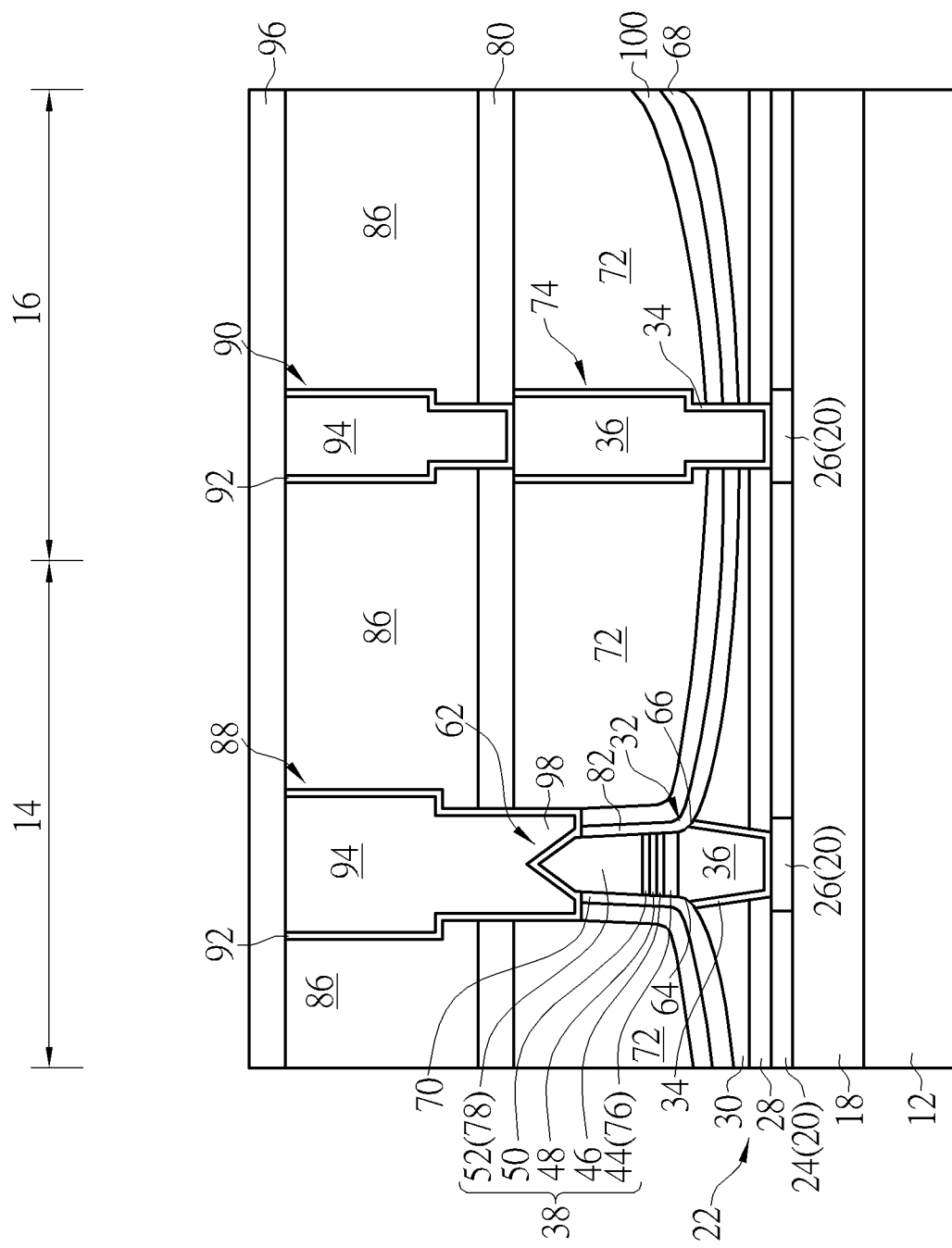
FIG. 11 illustrates a structural view of a semiconductor device according to an embodiment of the present invention.

Referring to FIG. 11, FIG. 11 illustrates a structural view of a semiconductor device according to an embodiment of the present invention. As shown in FIG. 11, it would be desirable to combine the embodiments from FIG. 7 and FIG. 9 by first forming a first liner 68 according to FIG. 3, skip the etching process conducted in FIG. 4, and then directly form a second liner 100 on the surface of the first liner 68. Next, processes conducted in FIGS. 5-6 could be carried out to form an IMD layer 72, a stop layer 80, and another IMD layer 86 on the second liner 100, and finally form metal interconnections 88, 90 to connect the MTJ 62 and the metal interconnection 74 respectively.

Moreover, similar to FIG. 7, in contrast to the bottom surface of the protrusions 98 contacting the top surfaces of the first spacer 70 and the second spacer 82 while sidewalls of the protrusions 98 are aligned with sidewalls of the first spacer 70 and second spacer 82, it would be desirable to adjust the width of the metal interconnection 88 so that the bottom surfaces of the protrusions 98 contact the top surfaces of the first spacer 70, second spacer 82, and second liner 100 while sidewalls of the protrusions 98 are aligned with sidewalls of the second liner 100, which is also within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
a magnetic tunneling junction (MTJ) on a substrate;
a spacer adjacent to the MTJ;
a liner adjacent to the spacer; and
a first metal interconnection on the MTJ, wherein the first metal interconnection comprises protrusions adjacent to two sides of the MTJ, a bottom surface of the protrusions contact the liner directly, and a width of the spacer directly contacting the protrusions is less than a width of the liner directly contacting the protrusions.

2. The semiconductor device of claim 1, further comprising:
a first inter-metal dielectric (IMD) layer around the liner;
a second metal interconnection under the MTJ; and
a second IMD layer around the second metal interconnection.

3. The semiconductor device of claim 1, wherein a top surface of the MTJ comprises a reverse V-shape.

4. The semiconductor device of claim 1, wherein a bottom surface of the first metal interconnection comprises a reverse V-shape.

5. The semiconductor device of claim 1, wherein a sidewall of the first metal interconnection is aligned with a sidewall of the liner.

6. The semiconductor device of claim 1, wherein a bottom surface of the protrusions contact the spacer directly.

7. A semiconductor device, comprising:
a magnetic tunneling junction (MTJ) on a substrate;
a first liner adjacent to the MTJ;
a second liner on a top surface of the first liner; and
a first metal interconnection on the MTJ, wherein a sidewall of the first metal interconnection is aligned with a sidewall of the first liner.

8. The semiconductor device of claim 7, further comprising:
a first inter-metal dielectric (1 MB) layer around the second liner;
a second metal interconnection under the MTJ; and
a second IMD layer around the second metal interconnection.

9. The semiconductor device of claim 8, wherein a thickness of the first liner on a sidewall of the MTJ is less than the thickness of the first liner on a top surface of the second IMD layer.

10. The semiconductor device of claim 7, wherein the first liner and the second liner are made of different materials.

11. The semiconductor device of claim 7, wherein the first metal interconnection comprises protrusions adjacent to two sides of the MTJ and a bottom surface of the protrusions contact the first liner directly.

12. The semiconductor device of claim 7, wherein a top surface of the MTJ comprises a reverse V-shape.

13. The semiconductor device of claim 7, wherein a bottom surface of the first metal interconnection comprises a reverse V-shape.

* * * * *